(12) United States Patent
Park et al.

(10) Patent No.: US 7,446,043 B2
(45) Date of Patent: Nov. 4, 2008

(54) CONTACT STRUCTURE HAVING SILICIDE LAYERS, SEMICONDUCTOR DEVICE EMPLOYING THE SAME, AND METHODS OF FABRICATING THE CONTACT STRUCTURE AND SEMICONDUCTOR DEVICE

(75) Inventors: Je-Min Park, Suwon-si (KR); Byung-Yoon Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 85 days.

(21) Appl. No.: 11/416,328

(22) Filed: May 2, 2006

(65) Prior Publication Data
US 2007/0059931 A1 Mar. 15, 2007

(30) Foreign Application Priority Data
Sep. 13, 2005 (KR) .................... 10-2005-0085404

(51) Int. Cl.
*H01L 21/44* (2006.01)
(52) U.S. Cl. ............... 438/682; 257/757; 257/E21.164; 257/E29.116; 438/664; 438/651
(58) Field of Classification Search ................ 438/682, 438/664, 651, 630, 582; 257/757, E21.164, 257/E21.165, E29.116
See application file for complete search history.

(56) References Cited

U.S. PATENT DOCUMENTS

| 5,081,065 | A | * | 1/1992 | Jonkers et al. ............. 438/453 |
| 5,659,194 | A | * | 8/1997 | Iwamatsu et al. ............ 257/377 |
| 5,766,997 | A | * | 6/1998 | Takeuchi .................... 438/257 |
| 6,200,849 | B1 | | 3/2001 | Kim |
| 6,440,828 | B1 | * | 8/2002 | Sato et al. .................... 438/533 |
| 2002/0048919 | A1 | * | 4/2002 | Iwamatsu et al. ............ 438/592 |
| 2002/0096726 | A1 | | 7/2002 | Koike |
| 2002/0182847 | A1 | * | 12/2002 | Yokoyama et al. .......... 438/622 |
| 2004/0029348 | A1 | * | 2/2004 | Lee ............................ 438/299 |

FOREIGN PATENT DOCUMENTS

| CN | 1365146 | 8/2002 |
| KR | 10-0285702 | 4/2000 |
| KR | 10-2001-0009033 | 2/2001 |
| KR | 10-2001-0027393 | 4/2001 |
| KR | 2002-0066585 | 8/2002 |
| KR | 10-2005-0002076 | 1/2005 |
| KR | 10-2005-0055225 | 6/2005 |

OTHER PUBLICATIONS

Notification of First Office Action issued in corresponding Chinese Patent Application No. 200610077873.8.

* cited by examiner

*Primary Examiner*—Caridad M Everhart
(74) *Attorney, Agent, or Firm*—Mills & Onello LLP

(57) ABSTRACT

A contact structure having silicide layers, a semiconductor device employing the same, and methods of fabricating the contact structure and semiconductor device are provided. The contact structure includes a first conductive region and a second conductive region on a substrate. An insulating layer covers the first and second conductive regions. A first contact hole and a second contact hole are formed through the insulating layer and expose the first and second conductive regions, respectively. A first silicide layer having a first thickness is on the first conductive region exposed by the first contact hole. A second silicide layer having a second thickness different than the first thickness is on the second conductive region exposed by the second contact hole.

24 Claims, 6 Drawing Sheets

CONTACT STRUCTURE HAVING SILICIDE LAYERS, SEMICONDUCTOR DEVICE EMPLOYING THE SAME, AND METHODS OF FABRICATING THE CONTACT STRUCTURE AND SEMICONDUCTOR DEVICE

This application claims the benefit of Korean Patent Application No. 10-2005-0085404, filed on Sep. 13, 2005, the disclosure of which is hereby incorporated herein by reference in its entirety.

BACKGROUND OF THE INVENTION

1. Field of the Invention

The present invention relates to a semiconductor device and a method of fabricating the same, and more particularly, to a contact structure, a semiconductor device employing the same, and methods of fabricating the contact structure and semiconductor device.

2. Description of Related Art

Discrete devices, such as MOS transistors, are widely used as switching devices in semiconductor devices. With the continued increase in integration density of semiconductor devices, the MOS transistor continues to be reduced in size. In general, when the MOS transistor is reduced in size, the channel resistance of the MOS transistor decreases so that the MOS transistor permits a high driving current and operates at a high switching rate. However, a reduction in the size of the MOS transistor causes not only the foregoing advantages but also some disadvantages.

In general, a reduction in the size of the MOS transistor leads to a decrease in the channel resistance of the MOS transistor, thus improving the switching rate of the MOS transistor. However, the reduction in the size of the MOS transistor can also result in an increase in the electrical resistance of a region (e.g., a conductive line and a contact region) that provides an electrical contact to the vicinity of the MOS transistor. Typically, as the size of the MOS transistor decreases, a channel length thereof also decreases. As a result, capacitance between a gate electrode and a channel of the MOS transistor can be further reduced, and the channel resistance of a channel region can be further lowered, and thus the MOS transistor can be improved in performance. However, a reduction in the channel length of the MOS transistor also leads to a decrease in the area of a contact region that forms an electrical contact with source/drain regions of the MOS transistor. Also, the reduction in the channel length of the MOS transistor can lead to an increased likelihood of the occurrence of the short channel effect. In order to prevent the occurrence of the short channel effect, it is necessary to reduce the junction depth of the source/drain regions of the MOS transistor.

FIGS. 1A and 1B are cross-sectional views illustrating a conventional method of fabricating a semiconductor device having a silicide layer. In FIGS. 1A and 1B, reference character A denotes a first transistor region, and reference character B denotes a second transistor region.

Referring to FIG. 1A, a semiconductor substrate 1 having an isolation layer 3 is prepared to define active regions. A first transistor having a first channel length is formed in the first transistor region A of the semiconductor substrate 1, and a second transistor having a second channel length is formed in the second transistor region B of the semiconductor substrate 1. Here, the second channel length is shorter than the first channel length. The first transistor may include a first gate pattern 11a and first source/drain regions 17a. The first gate pattern 11a may include a first gate dielectric layer 5a, a first gate electrode 7a, and a first hard mask layer 9a, which are sequentially stacked. Also, the first source/drain regions 17a may be formed in the semiconductor substrate 1 on both sides of the first gate pattern 11a. The second transistor may include a second gate pattern 11b and second source/drain regions 17b. The second gate pattern 11b may include a second gate dielectric layer 5b, a second gate electrode 7b, and a second hard mask layer 9b, which are sequentially stacked. Also, the second source/drain regions 17b may be formed in the semiconductor substrate 1 on both sides of the second gate pattern 11b.

A first gate spacer 15a is formed to cover a sidewall of the first gate pattern 11a, and a second gate spacer 15b is formed to cover a sidewall of the second gate pattern 11b. Thereafter, an insulating layer 19 is formed on the substrate having the first and second transistors and then patterned, thereby forming a first contact hole 19a and a second contact hole 19b. Thus, the first contact hole 19a exposes a first source/drain contact region of the first source/drain region 17a, and the second contact hole 19b exposes a second source/drain contact region of the second source/drain region 17b. The second transistor has a second channel length that is shorter than the first channel length of the first transistor. The second contact hole 19b may be formed using a conventional self-align contact technique.

Referring to FIG. 1B, a first silicide layer 21a having a first thickness is formed on a surface of the first source/drain contact region that is exposed by the first contact hole 19a, and simultaneously, a second silicide layer 21b having a second thickness is formed on a surface of the second source/drain region that is exposed by the second contact hole 19b. Here, the second thickness is equal to the first thickness. As a result, the first silicide layer 21a is formed in the first source/drain contact region that is spaced a predetermined distance apart from the first gate electrode 7a of the first transistor, and the second silicide layer 21b is formed in the second source/drain contact region contacting the second gate spacer 15b.

In order to lower the contact resistance of the first transistor, the first silicide layer 21a should not be less than a certain thickness. However, when the first silicide layer 21a has a large thickness to lower the contact resistance of the first transistor, the second silicide layer 21b that is formed during the formation of the first silicide layer 21a also has a large thickness. Since the second source/drain contact region of the second transistor is in contact with a sidewall of the second gate spacer 15b, as the thickness of the second silicide layer 21b increases, a ratio of the thickness of the second silicide layer 21b to the junction depth of the second source/drain region also increases. Further, a junction portion E between the second source/drain region and a channel region may come into contact with the second silicide layer 21b. Thus, a short circuit may occur between the second silicide layer 21b and a channel of the second transistor. As a result, the junction portion E may be defective.

SUMMARY OF THE INVENTION

An embodiment of the invention provides a contact structure having silicide layers of different thicknesses relative to each other.

Another embodiment of the invention provides a semiconductor device employing the contact structure.

Still another embodiment of the invention provides methods of fabricating the contact structure and the semiconductor device employing the same.

In one aspect, the present invention is directed to a contact structure having silicide layers. The contact structure includes a first conductive region and a second conductive region on a substrate. An insulating layer covers the first and second conductive regions. A first contact hole and a second contact hole are through the insulating layer and expose the first and second conductive regions, respectively. A first silicide layer having a first thickness is on the first conductive region exposed by the first contact hole. A second silicide layer having a second thickness different from the first thickness is on the second conductive region exposed by the second contact hole.

In some embodiments of the present invention, the first and second conductive regions may be a first impurity region and a second impurity region, respectively. In this case, the first thickness may be larger than the second thickness, and the first impurity region may have a greater junction depth than the second impurity region.

In other embodiments, the contact structure may further include a first contact plug and a second contact plug. The first contact plug may be on the first silicide layer to fill the first contact hole, and the second contact plug may be on the second silicide layer to fill the second contact hole. In this case, each of the first and second contact plugs may be a metal plug or a silicon plug.

In another aspect, the present invention is directed to a semiconductor device including the above-described contact structure. The semiconductor device includes a first transistor and a second transistor on the semiconductor substrate. The first transistor includes first source/drain regions and a first gate electrode that is over a first channel region interposed between the first source/drain regions. The second transistor includes second source/drain regions and a second gate electrode that is on a second channel region interposed between the second source/drain regions. An insulating layer is on the substrate having the first and second transistors. A first contact hole and a second contact hole are through the insulating layer. The first contact hole exposes at least one of the first source/drain regions, and the second contact hole exposes at least one of the second source/drain regions. A first silicide layer having a first thickness is on the first source/drain region exposed by the first contact hole. A second silicide layer having a second thickness different than the first thickness is on the second source/drain region exposed by the second contact hole.

In some embodiments, the first thickness may be larger than the second thickness, and the first source/drain region may have a greater junction depth than the second source/drain region. In this case, the first thickness may be larger than the second thickness, and a distance between the first contact hole and the first gate electrode may be greater than a distance between the second contact hole and the second gate electrode.

In other embodiments, a distance between the first contact hole and the first gate electrode may be greater than a distance between the second contact hole and the second gate electrode, and the first thickness may be larger than the second thickness.

In still other embodiments, the semiconductor device may further include a first contact plug and a second contact plug. The first contact plug may be on the first silicide layer to fill the first contact hole, and the second contact plug may be on the second silicide layer to fill the second contact hole. In this case, each of the first and second contact plugs may be a metal plug or a silicon plug.

In still another aspect, the present invention is directed to a method of fabricating a contact structure including silicide layers. The method includes forming a first conductive region and a second conductive region on a semiconductor substrate. An insulating layer is formed on the substrate having the first and second conductive regions. The insulating layer is patterned, thereby forming a first contact hole through the insulating layer to expose the first conductive region. A first silicide layer is formed to a first thickness on the first conductive region exposed by the first contact hole. The insulating layer is patterned, thereby forming a second contact hole through the insulating layer to expose the second conductive region. A second silicide layer is formed to a second thickness different from the first thickness on the second conductive region exposed by the second contact hole.

In some embodiments, the first and second conductive regions may be a first impurity region and a second impurity region, respectively. In this case, the first impurity region may be formed to a different junction depth from the second impurity region. One of the first and second silicide layers having a thickness that is the lesser of the first and second thicknesses is formed on one of the first and second impurity regions having a lesser junction depth.

In other embodiments, the formation of the second silicide layer may include forming a metal layer on the substrate having the second contact hole. An annealing process may be performed on the substrate having the metal layer. Thus, the second silicide layer may be selectively formed in the second conductive region exposed by the second contact hole and simultaneously, an unreacted metal layer may be left on the insulating layer and the first silicide layer. The unreacted metal layer may be selectively removed.

In still other embodiments, a first contact plug may be further formed on the first silicide layer to fill the first contact hole, and a second contact plug may be further formed on the second silicide layer to fill the second contact hole. The first and second contact plugs may be formed of a metal plug or a silicon plug.

In yet another aspect, the present invention is directed to a method of fabricating a semiconductor device including the foregoing contact structure. A first transistor and a second transistor are formed on a semiconductor substrate. The first transistor includes first source/drain regions and a first gate electrode that is over a first channel region interposed between the first source/drain regions. The second transistor includes second source/drain regions and a second gate electrode that is over a second channel region interposed between the second source/drain regions. An insulating layer is formed on the substrate having the first and second transistors. The insulating layer is patterned, thereby forming a first contact hole through the insulating layer to expose at least one of the first source/drain regions. A first silicide layer is formed to a first thickness on the first source/drain region exposed by the first contact hole. The insulating layer is patterned, thereby forming a second contact hole through the insulating layer to expose at least one of the second source/drain regions. A second silicide layer is formed to a second thickness different from the first thickness on the second source/drain region exposed by the second contact hole.

In some embodiments, the first source/drain region may be formed to a different junction depth from the second source/drain region. In this case, one of the first and second silicide layers having a thickness that is the lesser of the first and second thicknesses is formed on one of the first and second source/drain regions having a lesser junction depth.

In other embodiments, the first and second contact holes may be formed such that a distance between the first gate electrode and the first contact hole is different from a distance between the second gate electrode and the second contact hole. In this case, one of the first and second silicide layers having a thickness that is the lesser of the first and second thicknesses is formed on one of the first and second source/drain regions having a contact hole that is spaced apart from a corresponding gate electrode by a lesser distance.

In still other embodiments, the formation of the second silicide layer may include forming a metal layer on the substrate having the second contact hole. An annealing process may be performed on the substrate having the metal layer. Thus, the second silicide layer may be selectively formed in the second source/drain region exposed by the second contact hole and simultaneously, an unreacted metal layer may be left on the insulating layer and the first silicide layer. The unreacted metal layer may be selectively removed.

In yet other embodiments, a first contact plug may be further formed on the first silicide layer to fill the first contact hole, and a second contact plug may be further formed on the second silicide layer to fill the second contact hole. The first and second contact plugs may be formed of a metal plug or a silicon plug.

BRIEF DESCRIPTION OF THE DRAWINGS

The foregoing and other objects, features and advantages of the invention will be apparent from the more particular description of exemplary embodiments of the invention, as illustrated in the accompanying drawings. The drawings are not necessarily to scale, emphasis instead being placed upon illustrating the principles of the invention.

DETAILED DESCRIPTION OF EMBODIMENTS OF THE INVENTION

Figure 1A:
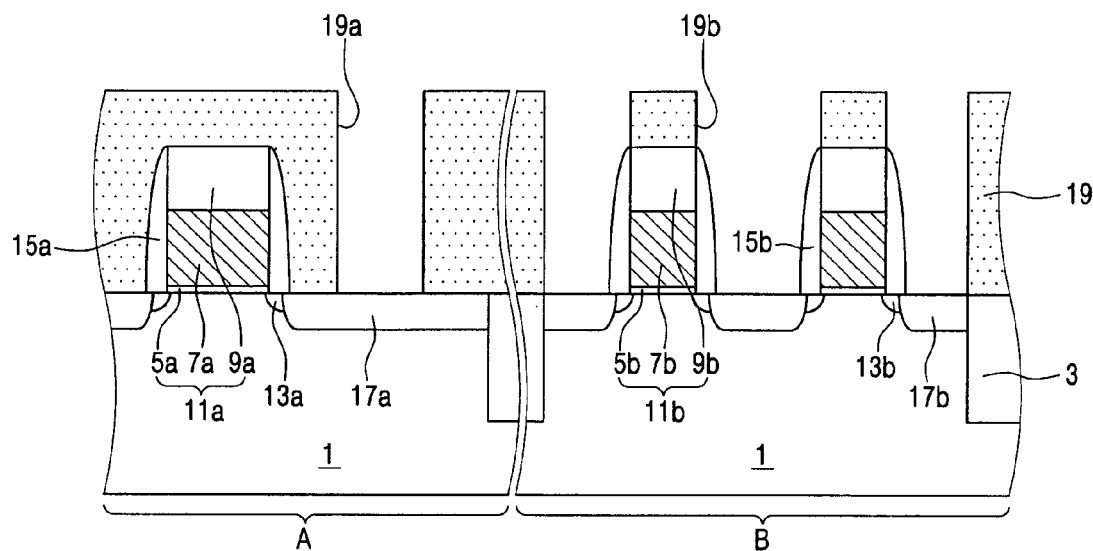
FIGS. 1A and 1B are cross-sectional views illustrating a conventional method of fabricating a semiconductor device having a silicide layer.
Figure 1B:
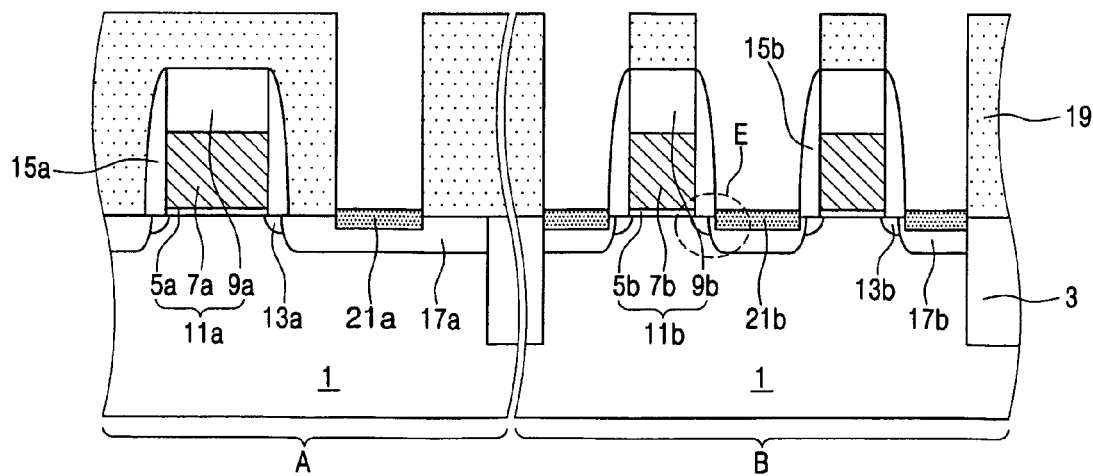

The present invention will now be described more fully hereinafter with reference to the accompanying drawings, in which preferred embodiments of the invention are shown. This invention may, however, be embodied in different forms and should not be construed as limited to the embodiments set forth herein. In the drawings and related specification, if a first layer is referred to as being "on" another layer, the first layer can be directly on the other layer, or intervening layers may be present. Like numbers refer to like elements throughout the specification.

Figure 2A:
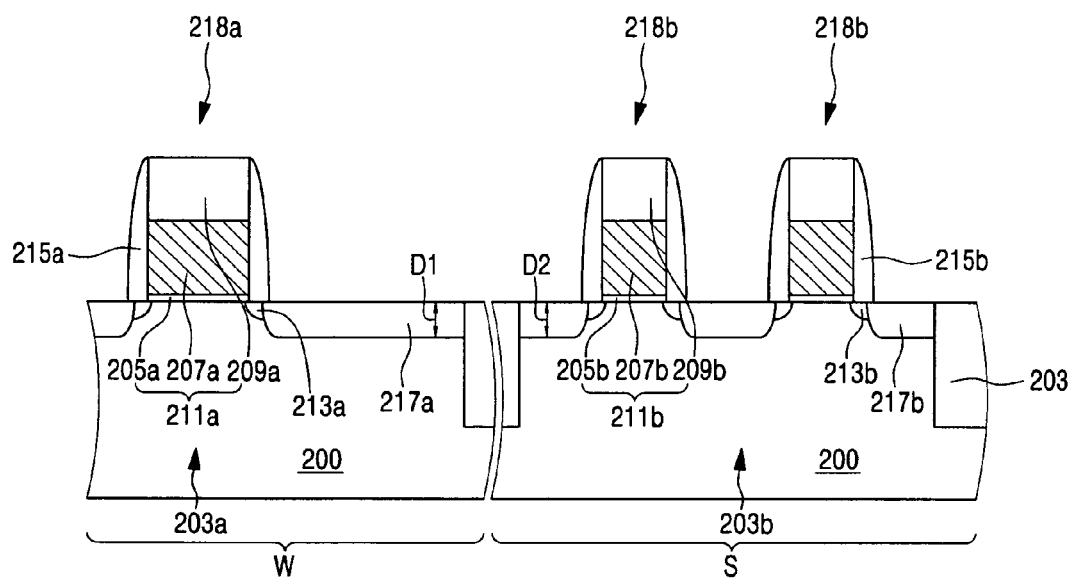
FIGS. 2A through 2C are cross-sectional views illustrating a method of fabricating a semiconductor device according to an exemplary embodiment of the present invention.
Figure 2B:
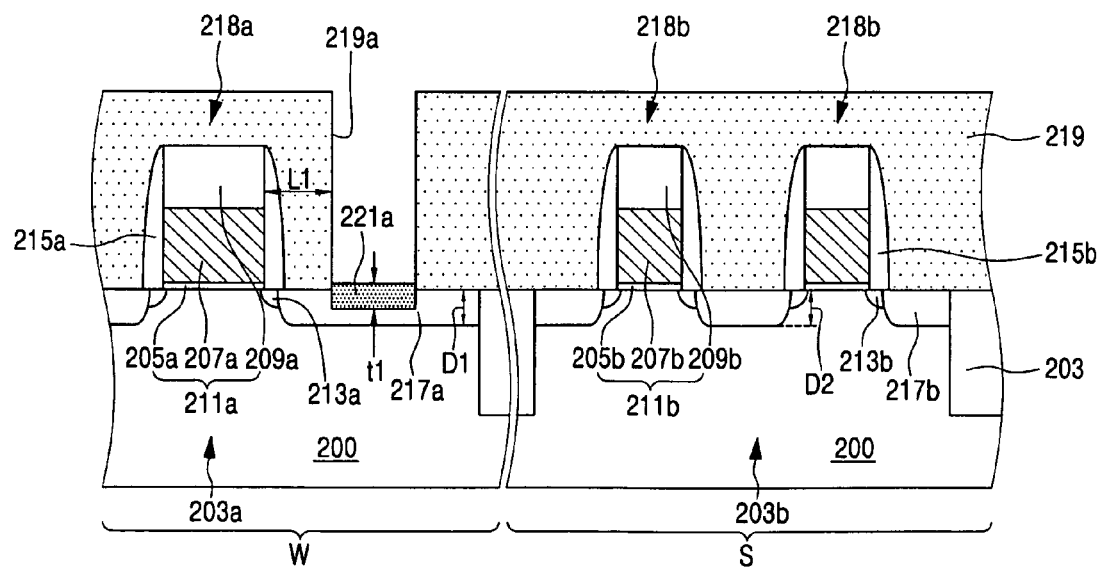
Figure 2C:
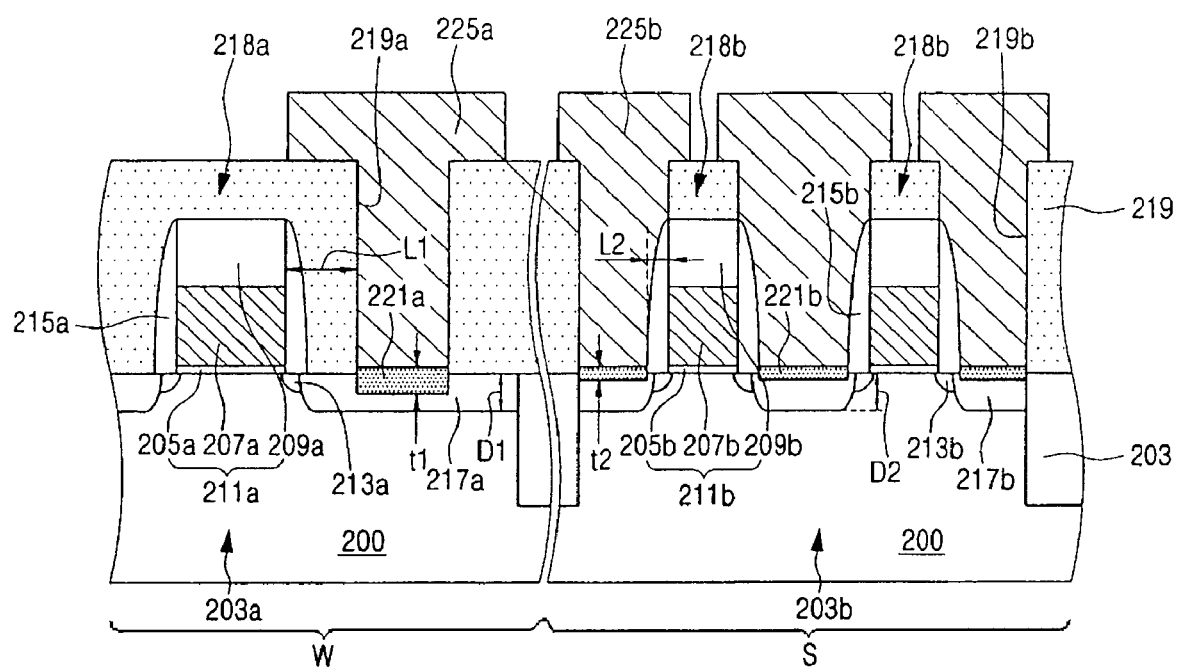
Figure 3A:
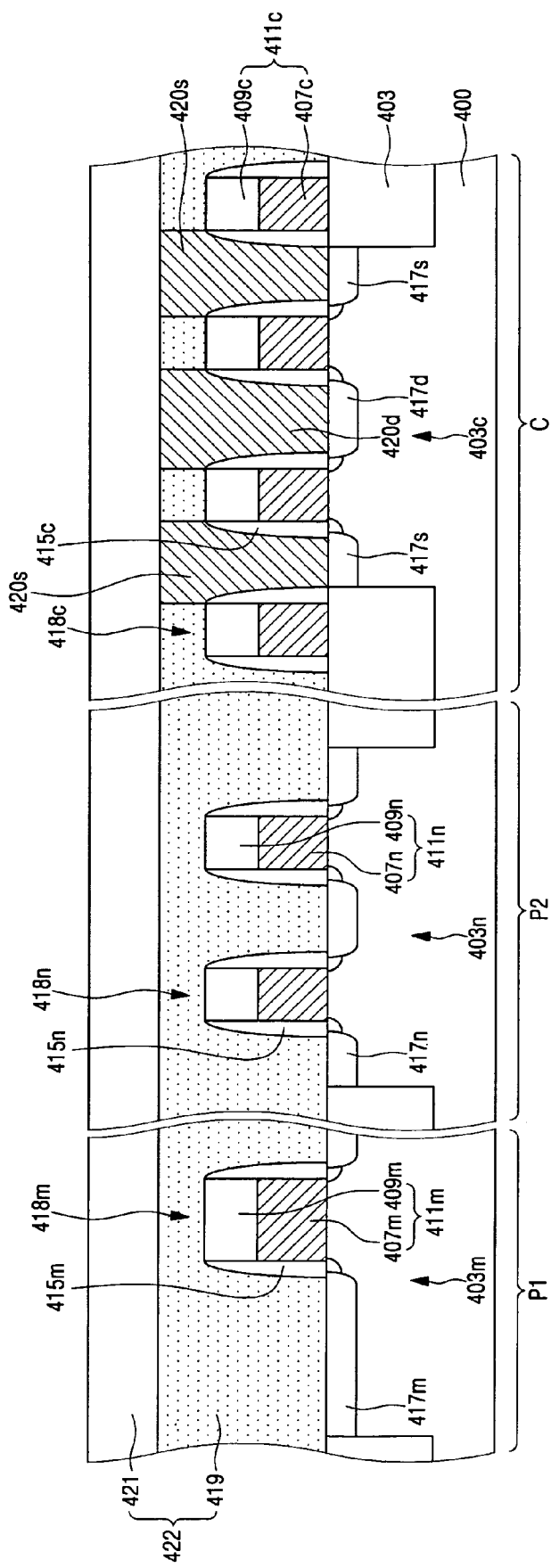
FIGS. 3A through 3C are cross-sectional views illustrating a method of fabricating a semiconductor device according to another exemplary embodiment of the present invention.
Figure 3B:
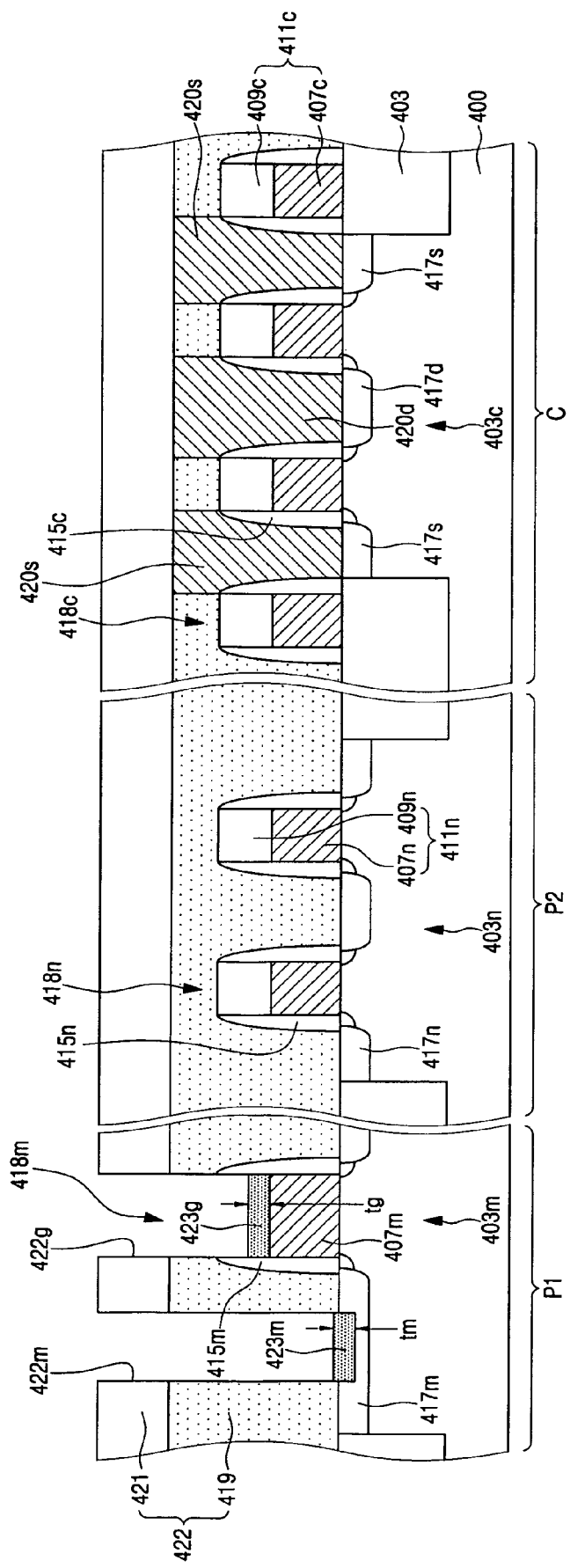
Figure 3C:
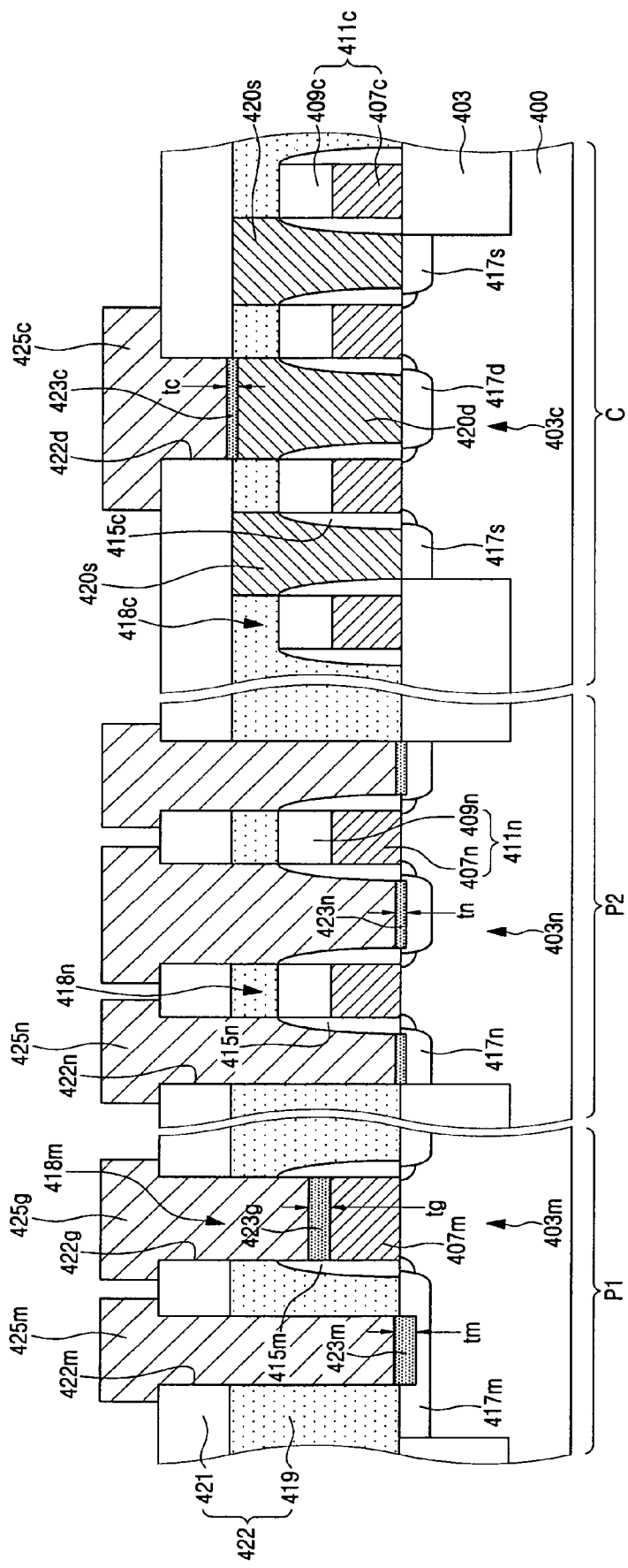

FIG. 2C is a cross-sectional view of a semiconductor device according to an exemplary embodiment of the present invention, and FIG. 3C is a cross-sectional view of a semiconductor device according to another exemplary embodiment of the present invention. In FIG. 2C, reference character W denotes a first region, and reference character S denotes a second region. In FIG. 3C, reference numeral P1 denotes a first peripheral circuit region, reference numeral P2 denotes a second peripheral circuit region, and reference character C denotes a cell region.

First, a contact structure and a semiconductor device employing the same according to an exemplary embodiment of the present invention will be described with reference to FIG. 2C.

Referring to FIG. 2C, a semiconductor substrate 200 includes a first region W and a second region S. A first conductive region 217a is disposed in the first region W of the semiconductor substrate 200, and a second conductive region 217b is disposed in the second region S of the semiconductor substrate 200. The first and second conductive regions 217a and 217b may be a first impurity region and a second impurity region, respectively. An insulating layer 219 is disposed on the semiconductor substrate 200 having the first and second conductive regions 217a and 217b. A first contact hole 219a and a second contact hole 219b are disposed through the insulating layer 219 and expose the first and second conductive regions 217a and 217b, respectively. A first silicide layer 221a is disposed on the first conductive region 217a exposed by the first contact hole 219a, and a second silicide layer 221b is disposed on the second conductive region 217b exposed by the second contact hole 219b. The first silicide layer 221a has a first thickness t1, and the second silicide layer 221b has a second thickness t2 different from the first thickness t1. When the first conductive region (i.e., a first impurity region 217a) has a greater junction depth than the second conductive region (i.e., a second impurity region 217b), the first thickness t1 may be larger than the second thickness t2. A first contact plug 225a may be disposed on the first silicide layer 221a to fill the first contact hole 219a, and a second contact plug 225b may be disposed on the second silicide layer 221b to fill the second contact hole 219b. The first contact plug 225a may be a metal plug or a silicon plug. For example, the metal plug may be a tungsten plug, and the silicon plug may be a doped polysilicon plug. As a result, the above-described components can constitute a contact structure.

Hereinafter, a semiconductor device having the above-described contact structure will be described.

The semiconductor substrate 200 includes a first region W and a second region S. An isolation layer 203 may be disposed in the semiconductor substrate 200 to define a first active region 203a and a second active region 203b. The first active region 203a may be disposed in the first region W, and the second active region 203b may be disposed in the second region S. A first transistor 218a is disposed in the first region W. The first transistor 218a may include first conductive regions (i.e., first source/drain regions 217a) and a first gate electrode 207a that is disposed over a first channel region interposed between the first source/drain regions 217a. Further, the first transistor 218a may have a well-known lightly doped drain (LDD) type source/drain structure. In other words, the first transistor 218a may include a first LDD region 213a as shown in FIG. 2C. A first gate pattern 211a may be disposed on the first channel region. The first gate pattern 211a may include a first gate dielectric layer 205a, a first gate electrode 207a, and a first hard mask layer 209a, which are sequentially stacked. The first hard mask layer 209a is optional and may be omitted.

A second transistor 218b is disposed in the second region S. The second transistor 218b may include second conductive regions (i.e., second source/drain regions 217b) and a second gate electrode 207b that is disposed over a second channel region interposed between the second source/drain regions 217b. Further, the second transistor 218b may have a well-known LDD type source/drain structure. In other words, the second transistor 218b may include a second LDD region 213b as shown in FIG. 2C. A second gate pattern 211b may be disposed on the second channel region. The second gate pattern 211b may include a second gate dielectric layer 205b, a second gate electrode 207b, and a second hard mask layer 209b, which are sequentially stacked. The second hard mask layer 209b is optional and may be omitted.

A first gate spacer 215a may be disposed to cover a sidewall of the first gate pattern 211a, and a second gate spacer 215b may be disposed to cover a sidewall of the second gate pattern 211b. Thereafter, an insulating layer 219 is disposed on the substrate 200 having the first and second transistors 218a and 218b.

A first contact hole 219a is disposed through the insulating layer 219 disposed in the first region W and exposes at least one of the first source/drain regions 217a of the first transistor 218a. The first contact hole 219a may be spaced a first distance L1 apart from the first gate electrode 207a.

A second contact hole 219b is disposed through the insulating layer 219 disposed in the second region S and exposes at least one of the second source/drain regions 217b of the second transistor 218b. The second contact hole 219b may be spaced a second distance L2 apart from the second gate electrode 207b. Here, the second distance L2 is less than the first distance L1.

Silicide layers having different thicknesses are disposed on the first source/drain regions 217a exposed by the first contact hole 219a and the second source/drain regions 217b exposed by the second contact hole 219b. Specifically, a first silicide layer 221a having a first thickness t1 is disposed on the first source/drain regions 217a exposed by the first contact hole 219a. Also, a second silicide layer 221b having a second thickness t2 is disposed on the second source/drain regions 217b exposed by the second contact hole 219b. Here, the second thickness t2 is less than the first thickness t1.

Since the first silicide layer 221a having the first thickness t1 is provided on the first source/drain regions 217a of the first transistor 218a, the contact resistance characteristics of the first source/drain regions 217a can be improved. Also, the second silicide layer 221b having the second thickness t2 less than the first thickness t1 is provided on the second source/drain regions 217b, thereby preventing a break in the junction of the second source/drain regions 217b from occurring.

Meanwhile, when the second silicide layer 221b is thinner than the first silicide layer 221a, the first source/drain regions 217a of the first transistor 218a may have a first junction depth D1, and the second source/drain regions 217b of the second transistor 218b may have a second junction depth D2 less than the first junction depth D1. Thus, a break in the junction of the second source/drain regions 217b can be prevented from occurring. Accordingly, since silicide layers having different thicknesses in accordance with the junction depth of source/drain regions are disposed in a contact region, an optimized transistor can be realized.

A first contact plug 225a may be disposed on the first silicide layer 221a to fill the first contact hole 219a, and a second contact plug 225b may be disposed on the second silicide layer 221b to fill the second contact hole 219b. The first contact plug 225a may be a metal plug or a silicon plug. For example, the metal plug may be a tungsten plug, and the silicon plug may be a doped polysilicon plug.

As described above, the silicide layers having different thicknesses are disposed in the first and second source/drain regions 217a and 217b of the transistors 218a and 218b, so that the semiconductor device can include the first and second transistors 218a and 218b, each having optimum performance.

Hereinafter, a semiconductor device according to another exemplary embodiment of the present invention will be described with reference to FIG. 3C.

Referring to FIG. 3C, a semiconductor substrate 400 includes a first peripheral circuit region P1, a second peripheral circuit region P2, and a cell region C. An isolation layer 403 may be disposed in the semiconductor substrate 400 to define a first peripheral active region 403m, a second peripheral active region 403n, and a cell active region 403c. The first peripheral active region 403m is disposed in the first peripheral circuit region P1, the second peripheral active region 403n is disposed in the second peripheral circuit region P2, and the cell active region 403c is disposed in the cell region C.

A first transistor 418m is disposed in the first peripheral circuit region P1. The first transistor 418m may include first source/drain regions 417m and a first gate electrode 407m that is disposed on a first channel region interposed between the first source/drain regions 417m. A second transistor 418n is disposed in the second peripheral circuit region P2. The second transistor 418n may include second source/drain regions 417n and a second gate pattern 411n that is disposed on a second channel region interposed between the second source/drain regions 417n. The second gate pattern 411n may include a second gate dielectric layer (not shown), a second gate electrode 407n, and a second hard mask layer 409n, which are sequentially stacked. A cell transistor 418c is disposed in the cell region C. The cell transistor 418c may include cell source/drain regions 417s and 417d and a cell gate pattern 411c that is disposed on a cell channel region interposed between the cell source/drain regions 417s and 417d. The cell gate pattern 411c may include a cell gate dielectric layer (not shown), a cell gate electrode 407c, and a cell hard mask layer 409c, which are sequentially stacked. The first transistor 418m may be a transistor having a first channel length, and the second transistor 418n may be a transistor having a second channel length smaller than the first channel length. That is, the first transistor 418m may be a long channel transistor, and the second transistor 418n may be a short channel transistor.

A first insulating layer 419 is disposed on the substrate having the first transistor 418m, the second transistor 418n, and the cell transistor 418c. A buried contact pad 420s and a direct contact pad 420d are disposed through the first insulating layer 419 and contact the cell source region 417s and the cell drain region 417d, respectively. A second insulating layer 421 covers the first insulating layer 419. The first and second insulating layers 419 and 421 together constitute an insulating layer 422.

The insulating layer 422 disposed in the first peripheral circuit region P1 includes a first source/drain contact hole 422m that exposes at least one of the first source/drain regions 417m. The insulating layer 422 disposed in the second peripheral circuit region P2 has a second source/drain contact hole 422n that exposes at least one of the second source/drain regions 417n. Also, the insulating layer 422 disposed in the cell region C has a direct contact hole 422d that exposes the direct contact pad 420d.

Furthermore, the insulating layer 422 may include a contact hole that exposes a gate contact region of a gate electrode of a transistor. That is, a gate contact hole 422g may be disposed in the insulating layer 422 to expose a gate contact region of the first gate electrode 407m of the first transistor 418m as shown in FIG. 3C.

Silicide layers having different thicknesses are disposed on the regions exposed by the contact holes 422m, 422n, and 422g. Specifically, a first silicide layer 423m having a first thickness tm is disposed on the first source/drain regions 417m exposed by the first source/drain contact holes 422m. A second silicide layer 423n having a second thickness tn is disposed on the second source/drain regions 417n exposed by the second source/drain contact holes 422n. Here, the second thickness tn is less than the first thickness tm.

Meanwhile, a gate silicide layer 423g having a third thickness tg may be disposed in the gate contact region exposed by the gate contact hole 422g. The third thickness tg may be substantially equal to the first thickness tm.

Also, a pad silicide layer 423c having a fourth thickness tc may be disposed in a pad contact region of the direct contact pad 420d exposed by the direct contact hole 422d. The fourth thickness tc may be substantially equal to the second thickness tn.

A first contact plug 425m is disposed on the first silicide layer 423m to fill the first source/drain contact hole 422m. A second contact plug 425n is disposed on the second silicide layer 423n to fill the second source/drain contact hole 422m. A gate contact plug 425g may be disposed on the gate silicide layer 423g to fill the gate contact hole 422g. A direct contact plug 425c may be disposed on the pad silicide layer 423c to fill the direct contact hole 422d.

As described above, since the silicide layers having different thicknesses are disposed on the regions exposed by the contact holes, the various types of transistors can be realized, each with optimum performance. In particular, a thin silicide layer may be disposed on the second source/drain regions 417n of the second transistor 418n, and a thick silicide layer may be disposed on the first source/drain regions 417m of the first transistor 418m. Thus, a break in the junction of the second source/drain regions 417n of the second transistor 418n with the short channel length (i.e., the short channel transistor) can be prevented from occurring, and, at the same time, the first transistor 418m with the long channel length (i.e., the long channel transistor) can have improved contact resistance characteristics. As a result, the semiconductor device can have excellent performance by optimizing each type of transistor.

Hereinafter, methods of fabricating semiconductor devices according to exemplary embodiments of the present invention will be described with reference to FIGS. 2A through 2C and 3A through 3C. Specifically, FIGS. 2A through 2C are cross-sectional views illustrating a method of fabricating a semiconductor device according to an exemplary embodiment of the present invention, and FIGS. 3A through 3C are cross-sectional views illustrating a method of fabricating a semiconductor device according to another exemplary embodiment of the present invention. In FIGS. 2A through 2C, reference character W denotes a first region, and reference character S denotes a second region. In FIGS. 3A through 3C, reference numeral P1 denotes a first peripheral circuit region, reference numeral P2 denotes a second peripheral circuit region, and reference character C denotes a cell region.

First, a method of fabricating a semiconductor device according to an exemplary embodiment of the present invention will be described with reference to FIGS. 2A through 2C.

Referring to FIG. 2A, a semiconductor substrate 200 including a first region W and a second region S is prepared. An isolation layer 203 is formed in the semiconductor substrate 200 to define a first active region 203a and a second active region 203b in the first region W and the second region S, respectively. A first gate pattern 211a is formed in the first active region 203a, and a second gate pattern 211b is formed in the second active region 203b. The first gate pattern 211a may include a first gate dielectric layer 205a, a first gate electrode 207a, and a first hard mask layer 209a, which are sequentially stacked. The second gate pattern 211b may include a second gate dielectric layer 205b, a second gate electrode 207b, and a second hard mask layer 209b, which are sequentially stacked. Here, the second gate electrode 207b is formed to have a smaller width than that of the first gate electrode 207a. In an embodiment where the first hard mask layer 209a and the second hard mask layer 209b are omitted, the first gate pattern 211a may include the first gate dielectric layer 205a and the first gate electrode 207a, which are sequentially stacked, and the second gate pattern 211b may include the second dielectric layer 205b and the second gate electrode 207b, which are sequentially stacked.

Thereafter, first impurity ions are implanted into the first and second active regions 203a and 203b of the semiconductor substrate 200 using the first and second gate patterns 211a and 211b and the isolation layer 203 as ion implantation masks, thereby forming LDD regions 213a and 213b. That is, a first LDD region 213a is formed in the first active region 203a, and a second LDD region 213b is formed in the second active region 203b. Here, the first impurity ions may be N-type impurity ions or P-type impurity ions.

A first gate spacer 215a may be formed to cover a sidewall of the first gate pattern 211a, and a second gate spacer 215b may be formed to cover a sidewall of the second gate pattern 211b. Second impurity ions are implanted into the first and second active regions 203a and 203b using the gate patterns 211a and 211b, the gate spacers 215a and 215b and the isolation layer 203 as ion implantation masks, thereby forming source/drain regions 217a and 217b. That is, first source/drain regions 217a are formed in the first active region 203a, and second source/drain regions 217b are formed in the second active region 203b. As a result, the first and second LDD regions 213a and 213b remain under the gate spacers 215a and 215b. The second impurity ions may also be N-type impurity ions or P-type impurity ions.

As a result, a first transistor 218a is formed in the first region W, and a second transistor 218b is formed in the second region S. The first transistor 218a includes the first source/drain regions 217a and a first gate pattern 211a including the first gate electrode 207a that is disposed over a first channel region interposed between the first source/drain regions 217a. The second transistor 218b includes the second source/drain regions 217b and a second gate pattern 211b including the second gate electrode 207b that is disposed over a second channel region interposed between the second source/drain regions 217b.

Meanwhile, the first source/drain regions 217a may be formed to a different junction depth that that of the second source/drain regions 217b. For example, the first source/drain regions 217a may be formed to a first junction depth D1, and the second source/drain regions 217b may be formed to a second junction depth D2 that is less than the first junction depth D1.

Referring to FIG. 2B, an insulating layer 219 is formed on the semiconductor substrate 200 having the first and second transistors 218a and 218b. The insulating layer 219 may be formed of a material having an etch selectivity with respect to the gate spacers 215a and 215b. For instance, when the gate spacers 215a and 215b are formed of silicon nitride, the insulating layer 219 may be formed of silicon oxide.

The insulating layer 219 is patterned, thereby forming a first contact hole 219a that exposes the first source/drain region 217a of the first transistor 218a. The first contact hole 219a may be spaced a first distance L1 apart from the gate electrode 207a.

Thereafter, a first metal layer is formed on the substrate having the first contact hole 219a. The first metal layer may be formed of nickel, cobalt, tungsten, tantalum, titanium or an alloy thereof. Subsequently, a thermal process is carried out, thereby forming a first silicide layer 221a having a first thickness t1 in a predetermined region of the first source/drain regions 217a. Then, an unreacted portion of the first metal layer is removed from the insulating layer 219.

Referring to FIG. 2C, the insulating layer 219 is patterned, thereby forming a second contact hole 219b that exposes at least one of the second source/drain regions 217b of the second transistor 218b. In this case, the formation of the second contact hole 219b may be performed using a self-aligned contact technique. As a result, the second source/drain regions 217b exposed by the second contact hole 219b may be adjacent to the second gate spacer 215b. Accordingly, a distance between the second contact hole 219b and the second gate electrode 207b may be shorter than a distance between the first contact hole 219a and the first gate electrode 207a. In other words, a second distance L2 between the second contact hole 219b and the second gate electrode 207b may be smaller than the first distance L1 between the first contact hole 219a and the first gate electrode 207a.

A second metal layer is formed on the substrate having the second contact hole 219b. In this case, the second metal layer may be formed to cover the first silicide layer 221a and the exposed second source/drain regions 217b. The second metal layer may be formed of nickel, cobalt, tungsten, tantalum, titanium or an alloy thereof. Subsequently, a thermal process may be performed, thereby forming a second silicide layer 221b on the second source/drain regions 217b. Here, the second silicide layer 221b is formed to a second thickness t2 that is different than the first thickness t1 of the first silicide layer 221a. For example, the second thickness t2 of the second silicide layer 221b may be less than the first thickness t1 of the first silicide layer 221a. In this case, the first silicide layer 221a can function as a barrier layer that suppresses the second metal layer covering the first silicide layer 221a from reacting with silicon atoms of the semiconductor substrate 200. Thereafter, an unreacted portion of the second metal layer is removed from the insulating layer 219.

Meanwhile, the second metal layer covering the first silicide layer 221a may react with silicon atoms of the semiconductor device 200, and thus the thickness t1 of the first silicide layer 221a can further increase. Alternatively, the second metal layer covering the first silicide layer 221a may react with the first silicide layer 221a, and thus the thickness of the first silicide layer 221a can decrease. Although it is described in the present embodiment that the first silicide layer 221a is first formed and then the second silicide layer 221b is subsequently formed, the present invention is not limited thereto. Assuming that a silicide layer that is previously formed is hardly affected by a process of forming a subsequent silicide layer, the process of forming the second silicide layer 221b having the second thickness t2 can optionally precede the process of forming the first silicide layer 221a having the first thickness t1.

A first contact plug 225a may be formed on the first silicide layer 221a to fill the first contact hole 219a, and a second contact plug 225b may be formed on the second silicide layer 221b to fill the second contact hole 219b. In this case, the first and second contact plugs 225a and 225b may be formed of metal or silicon. For example, the metal may be tungsten, and the silicon may be doped polysilicon.

The first silicide layer 221a formed in the first source/drain regions 217a of the first transistor 218a is spaced a predetermined distance apart from a junction portion of the first source/drain regions 217a that is adjacent to the channel region of the first transistor 218a, so that the first silicide layer 221a can be formed to a relatively large thickness. As a result, the performance of the first transistor 218a can be enhanced. Further, the second silicide layer 221b formed in the second source/drain regions 217b of the second transistor 218b is formed to the second thickness t2 that is less than the first thickness t1, so that the second silicide layer 221b can be spaced a predetermined distance apart from a junction portion of the second source/drain regions 217b that is adjacent to the channel region of the second transistor 218b. Accordingly, a break in the junction of the second source/drain regions 217b can be prevented.

Meanwhile, when the first source/drain regions 217a are formed to a first junction depth D1 and the second source/drain regions 217b are formed to a second junction depth D2 less than the first junction depth D1, the first silicide layer 221a formed in the first source/drain regions 217a having the first junction depth D1 may be formed to the first thickness t1, and the second silicide layer 221b formed in the second source/drain regions 217b having the second junction depth D2 may be formed to the second thickness t2 less than the first thickness t1. As a result, the contact resistance of the first and second source/drain regions 217a can be lowered while preventing the break in the junction of the second source/drain regions 217b. Accordingly, it is possible to fabricate the transistors 218a and 218b, each with optimum performance.

Hereinafter, a method of fabricating a semiconductor device according to another exemplary embodiment of the present invention will be described with reference to FIGS. 3A through 3C.

Referring to FIG. 3A, a semiconductor substrate 400 having a first peripheral circuit region P1, a second peripheral circuit region P2, and a cell region C is prepared. An isolation layer 403 is formed in the semiconductor substrate 400, and thus a first active region 403m, a second active region 403n, and a cell active region 403c are defined in the first peripheral circuit region P1, the second peripheral circuit region P2, and the cell region C, respectively. Thereafter, a first transistor 418m, a second transistor 418n, and a cell transistor 418c are formed in the first active region 403m, the second active region 403n, and the cell active region 403c, respectively.

The first transistor 418m may include a first gate pattern 411m and first source/drain regions 417m. The second transistor 418n may include a second gate pattern 411n and second source/drain regions 417n. The cell transistor 418c may include a cell gate pattern 411c, a cell source region 417s, and a cell drain region 417d.

The first gate pattern 411m may include a first gate dielectric layer (not shown), a first gate electrode 407m, and a first hard mask layer 409m, which are sequentially stacked. The second gate pattern 411n may include a second gate dielectric layer (not shown), a second gate electrode 407n, and a second hard mask layer 409n, which are sequentially stacked. The cell gate pattern 411c may include a cell gate dielectric layer (not shown), a cell gate electrode 407c, and a cell hard mask layer 409c, which are sequentially stacked. The formation of the hard mask layers 409m, 409n, and 409c may optionally be omitted. A first gate spacer 415m is formed to cover a sidewall of the first gate pattern 411m, a second gate spacer 415n is formed to cover a sidewall of the second gate pattern 411n, and a cell gate spacer 415c is formed to cover a sidewall of the cell gate pattern 411c.

A first insulating layer 419 is formed on the substrate having the transistors 418m, 418n, and 418c. The first insulating layer 419 may be formed of a material having an etch selectivity with respect to the gate spacers 415m, 415n, and 415c. For example, when the gate spacers 415m, 415n, and 415c are formed of silicon nitride, the first insulating layer 419 may be formed of silicon oxide. A buried contact pad 420s and a direct contact pad 420d are formed using a well-known self-aligned contact technique. The buried contact pad 420s and the direct contact pad 420d are formed through the first insulating layer 419 and come into contact with surfaces of the cell source region 417s and the cell drain region 417b, respectively. Thereafter, a second insulating layer 421 is formed on the substrate having the contact pads 420s and 420b. The second insulating layer 421 and the first insulating layer 419 may constitute an insulating layer 422.

Referring to FIG. 3B, the insulating layer 422 is patterned, thereby forming a first source/drain contact hole 422m that exposes the first source/drain region 417m of the first transistor 418m. The first source/drain contact hole 422m may be formed a predetermined distance apart from the gate electrode 407m.

Meanwhile, the insulating layer 422 may be additionally patterned, thereby forming a gate contact hole 422g during the formation of the first source/drain contact hole 422m. In this case, the gate contact hole 422g may expose a gate contact region of the first gate electrode 407m.

A first metal layer is formed on the substrate having the first source/drain contact hole 422m. The first metal layer may be formed of nickel, cobalt, tungsten, tantalum, titanium, or an alloy thereof. Thereafter, a thermal process is performed on the substrate having the first metal layer, thereby forming a first silicide layer 423m having a first thickness tm in the first source/drain contact regions.

Meanwhile, when the gate contact hole 422g is formed while forming the first source/drain contact hole 422m, a gate silicide layer 423g may be formed in the gate contact region of the first gate electrode 407m while forming the first silicide layer 423m. The gate silicide layer 423g may be formed to a third thickness tg that is substantially equal to the first thickness tm.

Referring to FIG. 3C, the insulating layer 422 is patterned, thereby forming a second source/drain contact hole 422n that exposes the second source/drain region 417n of the second transistor 418n. The second source/drain contact hole 422n may be formed a predetermined distance apart from the second gate electrode 407n. That is, a distance between the second source/drain contact hole 422n and the second gate electrode 407n may be shorter than a distance between the first source/drain contact hole 422m and the first gate electrode 407m.

Meanwhile, a direct contact hole 422d may be formed while forming the second source/drain contact hole 422n. The direct contact hole 422d may expose a pad contact region of the direct contact pad 420d.

A second metal layer is formed on the substrate having the second source/drain contact hole 422n. The second metal layer may be formed of nickel, cobalt, tungsten, tantalum, titanium, or an alloy thereof. A thermal process is performed on the substrate having the second metal layer. Thus, a second silicide layer 423n is formed on the second source/drain regions 417n exposed by the second source/drain contact hole 422n. The second silicide layer 423n is formed to a second thickness tn that is different than the first thickness tm. For example, the second thickness tn may be less than the first thickness tm.

Meanwhile, when the direct contact hole 422d is formed while forming the second source/drain contact hole 422n, a pad silicide layer 423c may be formed while forming the second silicide layer 423n. The pad silicide layer 423c may be formed on the direct contact pad 420d exposed by the direct contact hole 422d. Also, the pad silicide layer 423c may be formed to a fourth thickness tc that is substantially equal to the second thickness tn.

A first contact plug 425m may be formed on the first silicide layer 423m to fill the first source/drain contact hole 422m, and a second contact plug 425n may be formed on the second silicide layer 423n to fill the second source/drain contact hole 422n. During the formation of the first and second contact plugs 425m and 425n, a gate contact plug 425g may be formed on the gate silicide layer 423g to fill the gate contact hole 422g, and a direct contact plug 425d may be formed on the pad silicide layer 423c to fill the direct contact hole 422d. The first and second contact plugs 425m and 425n, the gate contact plug 425g, and the direct contact plug 425d may be formed using a well-known direct contact technique. That is, the first and second contact plugs 425m and 425n, the gate contact plug 425g, and the direct contact plug 425d may be formed at the same time as metal interconnections.

Although it is described that the formation of the first silicide layer 423m is followed by the formation of the second silicide layer 423n, the present invention is not limited thereto. Assuming that a preceding silicide layer is largely unaffected by a process of forming a subsequent silicide layer, the process of forming the second silicide layer 423n may optionally precede the process of forming the first silicide layer 423m. Also, it is described that the pad silicide layer 423c is formed at the same time as the second silicide layer 423n, but the present invention is not limited thereto. In other words, the pad silicide layer 423c may be formed by an additional process.

Consequently, a distance between the first silicide layer 423m having the first thickness tm and the first gate electrode 407m may be greater than a distance between the second silicide layer 423n having the second thickness tn less than the first thickness tm and the second gate electrode 407n. Thus, the first silicide layer 423m formed in the first source/drain regions 417m of the first transistor 418m is spaced a predetermined distance apart from a junction portion of the first source/drain regions 417m that is adjacent to a channel region of the first transistor 418m, so that the first silicide layer 423m can be formed to have a large thickness. As a result, the first transistor 418m can have improved performance characteristics. Further, since the second silicide layer 423n formed in the second source/drain regions 417n of the second transistor 418n is formed to the second thickness tn less than the first thickness tm, the second silicide layer 423n can be spaced a predetermined distance apart from a junction portion of the second source/drain regions 417n that is adjacent to a channel region of the second transistor 418n. Therefore, a break in the junction of the second source/drain regions 417n can be prevented from occurring. As described above, silicide layers having different thicknesses are formed in regions having different characteristics, thus realizing a semiconductor device with optimum performance.

As described above, the present invention provides a contact structure in which silicide layers having different thicknesses are formed in different contact regions. By forming a semiconductor device using the foregoing contact structure, the semiconductor device having high-performance contact regions can be realized. In particular, in the case of a semiconductor device having transistors with various sizes, silicide layers are formed to different thicknesses so that a break in the junction of each of source/drain regions can be prevented and so that contact resistance can be lowered. As a result, a semiconductor device with optimum performance can be formed.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A contact structure comprising:
   a substrate;

a first conductive region and a second conductive region on the substrate;
an insulating layer covering the first and second conductive regions;
a first contact hole and a second contact hole through the insulating layer and exposing the first and second conductive regions, respectively;
a first silicide layer on the first conductive region exposed by the first contact hole and having a first thickness; and
a second silicide layer on the second conductive region exposed by the second contact hole and having a second thickness that is different than the first thickness, wherein the first and second conductive regions are a first impurity region and a second impurity region, respectively, wherein the first thickness is larger than the second thickness, and the first impurity region has a greater junction depth than that of the second impurity region.

2. The contact structure according to claim 1, further comprising:
a first contact plug on the first silicide layer and filling the first contact hole; and
a second contact plug on the second silicide layer and filling the second contact hole.

3. The contact structure according to claim 2, wherein each of the first and second contact plugs is a metal plug or a silicon plug.

4. A semiconductor device comprising:
a semiconductor substrate;
a first transistor on the semiconductor substrate, and having first source/drain regions and
a first gate electrode that is over a first channel region interposed between the first source/drain regions;
a second transistor on the semiconductor substrate, and having second source/drain regions and a second gate electrode that is on a second channel region interposed between the second source/drain regions;
an insulating layer on the substrate having the first and second transistors;
a first contact hole and a second contact hole through the insulating layer, the first contact hole exposing at least one of the first source/drain regions, the second contact hole exposing at least one of the second source/drain regions;
a first silicide layer on the first source/drain region exposed by the first contact hole, and having a first thickness; and
a second silicide layer on the second source/drain region exposed by the second contact hole, and having a second thickness that is different than the first thickness, wherein the first thickness is larger than the second thickness, and the first source/drain regions have a greater junction depth than the second source/drain regions.

5. The semiconductor device according to claim 4, wherein a distance between the first contact hole and the first gate electrode is greater than a distance between the second contact hole and the second gate electrode.

6. The semiconductor device according to claim 4, wherein a distance between the first contact hole and the first gate electrode is greater than a distance between the second contact hole and the second gate electrode, and the first thickness is larger than the second thickness.

7. The semiconductor device according to claim 4, further comprising:
a first contact plug on the first suicide layer and filling the first contact hole; and
a second contact plug on the second silicide layer and filling the second contact hole.

8. The semiconductor device according to claim 7, wherein each of the first and second contact plugs is a metal plug or a silicon plug.

9. A method of fabricating a contact structure, comprising:
forming a first conductive region and a second conductive region on a semiconductor substrate;
forming an insulating layer on the substrate having the first and second conductive regions;
patterning the insulating layer and forming a first contact hole through the insulating layer to expose the first conductive region;
forming a first silicide layer having a first thickness on the first conductive region exposed by the first contact hole;
patterning the insulating layer and forming a second contact hole through the insulating layer to expose the second conductive region; and
forming a second silicide layer having a second thickness different than the first thickness on the second conductive region exposed by the second contact hole, wherein the first and second conductive regions are first and second impurity regions, respectively, wherein the first impurity region is formed to a different junction depth than the second impurity region.

10. The method according to claim 9, wherein one of the first and second silicide layers having a thickness that is the lesser of the first and second thicknesses is formed on one of the first and second impurity regions having a lesser junction depth.

11. The method according to claim 9, wherein forming the second silicide layer comprises:
forming a metal layer on the substrate having the second contact hole;
annealing the substrate having the metal layer to selectively form the second silicide layer in the second conductive region exposed by the second contact hole and simultaneously leave an unreacted metal layer on the insulating layer and the first silicide layer; and
selectively removing the unreacted metal layer.

12. The method according to claim 9, further comprising forming a first contact plug on the first silicide layer to fill the first contact hole and forming a second contact plug on the second silicide layer to fill the second contact hole.

13. The method according to claim 12, wherein the first and second contact plugs are formed of a metal plug or a silicon plug.

14. A method of fabricating a semiconductor device, comprising: forming a first transistor and a second transistor on a semiconductor substrate, the first transistor having first source/drain regions and a first gate electrode that is over a first channel region interposed between the first source/drain regions, the second transistor having second source/drain regions and a second gate electrode that is over a second channel region interposed between the second source/drain regions;
forming an insulating layer on the substrate having the first and second transistors;
patterning the insulating layer and forming a first contact hole through the insulating layer to expose at least one of the first source/drain regions;
forming a first silicide layer having a first thickness on the first source/drain region exposed by the first contact hole;
patterning the insulating layer and forming a second contact hole through the insulating layer to expose at least one of the second source/drain regions; and forming a second silicide layer having a second thickness that is different than the first thickness on the second source/drain region exposed by the second contact hole, wherein the first source/drain region is formed to a different junction depth than the second source/drain region.

15. The method according to claim 14, wherein one of the first and second suicide layers having a thickness that is the lesser of the first and second thicknesses is formed on one of the first and second source/drain regions having a lesser junction depth.

16. The method according to claim 14, wherein the first and second contact holes are formed such that a distance between the first gate electrode and the first contact hole is different from a distance between the second gate electrode and the second contact hole.

17. The method according to claim 16, wherein one of the first and second silicide layers having a thickness that is the lesser of the first and second thicknesses is formed on one of the first and second source/drain regions having a contact hole that is spaced apart from a corresponding gate electrode by a lesser distance.

18. The method according to claim 14, wherein forming the second silicide layer comprises:
   forming a metal layer on the substrate having the second contact hole;
   annealing the substrate having the metal layer to selectively form the second silicide layer in the second source/drain region exposed by the second contact hole and simultaneously leave an unreacted metal layer on the insulating layer and the first silicide layer; and
   selectively removing the unreacted metal layer.

19. The method according to claim 14, further comprising forming a first contact plug on the first silicide layer to fill the first contact hole and forming a second contact plug on the second silicide layer to fill the second contact hole.

20. The method according to claim 19, wherein the first and second contact plugs are formed of a metal plug or a silicon plug.

21. A semiconductor device comprising:
   a semiconductor substrate; a first transistor on the semiconductor substrate, and having first source/drain regions and
   a first gate electrode that is over a first channel region interposed between the first source/drain regions;
   a second transistor on the semiconductor substrate, and having second source/drain regions and a second gate electrode that is on a second channel region interposed between the second source/drain regions;
   an insulating layer on the substrate having the first and second transistors;
   a first contact hole and a second contact hole through the insulating layer, the first contact hole exposing at least one of the first source/drain regions, the second contact hole exposing at least one of the second source/drain regions;
   a first silicide layer on the first source/drain region exposed by the first contact hole, and having a first thickness; and
   a second silicide layer on the second source/drain region exposed by the second contact hole, and having a second thickness that is different than the first thickness, wherein a distance between the first contact hole and the first gate electrode is greater than a distance between the second contact hole and the second gate electrode, and the first thickness is larger than the second thickness.

22. A semiconductor device comprising:
   a semiconductor substrate;
   a first transistor on the semiconductor substrate, and having first source/drain regions and a first gate electrode that is over a first channel region interposed between the first source/drain regions;
   a second transistor on the semiconductor substrate, and having second source/drain regions and a second gate electrode that is on a second channel region interposed between the second source/drain regions;
   an insulating layer on the substrate having the first and second transistors; a first contact hole and a second contact hole through the insulating layer, the first contact hole exposing at least one of the first source/drain regions, the second contact hole exposing at least one of the second source/drain regions;
   a first silicide layer on the first source/drain region exposed by the first contact hole, and having a first thickness;
   a second silicide layer on the second source/drain region exposed by the second contact hole, and having a second thickness that is different than the first thickness;
   a first contact plug on the first silicide layer and filling the first contact hole; and
   a second contact plug on the second silicide layer and filling the second contact hole.

23. The semiconductor device according to claim 22, wherein each of the first and second contact plugs is a metal plug or a silicon plug.

24. A method of fabricating a semiconductor device, comprising:
   forming a first transistor and a second transistor on a semiconductor substrate, the first transistor having first source/drain regions and a first gate electrode that is over a first channel region interposed between the first source/drain regions, the second transistor having second source/drain regions and a second gate electrode that is over a second channel region interposed between the second source/drain regions;
   forming an insulating layer on the substrate having the first and second transistors;
   patterning the insulating layer and forming a first contact hole through the insulating layer to expose at least one of the first source/drain regions;
   forming a first suicide layer having a first thickness on the first source/drain region exposed by the first contact hole;
   patterning the insulating layer and forming a second contact hole through the insulating layer to expose at least one of the second source/drain regions; and
   forming a second silicide layer having a second thickness that is different than the first thickness on the second source/drain region exposed by the second contact hole, wherein the first and second contact holes are formed such that a distance between the first gate electrode and the first contact hole is different from a distance between the second gate electrode and the second contact hole.

* * * * *

UNITED STATES PATENT AND TRADEMARK OFFICE
CERTIFICATE OF CORRECTION

PATENT NO.         : 7,446,043 B2
APPLICATION NO. : 11/416328
DATED              : November 4, 2008
INVENTOR(S)       : Je-Min Park et al.

Page 1 of 1

It is certified that error appears in the above-identified patent and that said Letters Patent is hereby corrected as shown below:

Column 15, line 66 claim 7 delete "suicide" and insert --silicide--

Column 17, line 8 claim 15 delete "suicide" and insert --silicide--

Column 18, line 47 claim 24 delete "suicide" and insert --silicide--

Signed and Sealed this

Tenth Day of March, 2009

JOHN DOLL
*Acting Director of the United States Patent and Trademark Office*